(12) United States Patent
Werker

(10) Patent No.: US 9,401,720 B2
(45) Date of Patent: Jul. 26, 2016

(54) CIRCUIT ARRANGEMENT AND METHOD FOR CLOCK AND/OR DATA RECOVERY

(71) Applicant: SILICON LINE GMBH, Munich (DE)

(72) Inventor: Heinz Werker, Huglfing (DE)

(73) Assignee: Silicon Line GmbH, Munich (DE)

( * ) Notice: Subject to any disclaimer, the term of this patent is extended or adjusted under 35 U.S.C. 154(b) by 0 days.

(21) Appl. No.: 14/575,764

(22) Filed: Dec. 18, 2014

(65) Prior Publication Data

US 2015/0349944 A1    Dec. 3, 2015

Related U.S. Application Data

(63) Continuation of application No. PCT/DE2013/200021, filed on Jun. 18, 2013.

(30) Foreign Application Priority Data

Jun. 18, 2012 (DE) .......................... 10 2012 105 292

(51) Int. Cl.
| | |
|---|---|
| H04L 7/00 | (2006.01) |
| H03L 7/08 | (2006.01) |
| H04B 1/00 | (2006.01) |
| H03L 7/113 | (2006.01) |
| H04L 7/033 | (2006.01) |

(52) U.S. Cl.
CPC .............. *H03L 7/0807* (2013.01); *H03L 7/113* (2013.01); *H04B 1/0082* (2013.01); *H04L 7/033* (2013.01)

(58) Field of Classification Search
CPC ..... H04L 7/0337; H04L 7/0334; H04L 7/033; H04L 7/0029; H04L 7/0008; H04L 7/02; H04L 7/0331; H04L 7/0338; H03L 7/091; H03L 7/0814; G06F 1/10
USPC ......... 375/371, 267, 260, 259, 295, 316, 219, 375/355, 354
See application file for complete search history.

(56) References Cited

U.S. PATENT DOCUMENTS

| | | | |
|---|---|---|---|
| 2003/0002601 A1 | 1/2003 | Schroedinger | |
| 2005/0242890 A1 | 11/2005 | Wu et al. | |
| 2006/0006914 A1 | 1/2006 | Fan-Jiang | |
| 2007/0173219 A1* | 7/2007 | Kim | H03L 7/099 455/260 |
| 2011/0169535 A1* | 7/2011 | Kyles | H03L 7/07 327/156 |

FOREIGN PATENT DOCUMENTS

DE    10132232 C1    11/2002

* cited by examiner

*Primary Examiner* — Zewdu Kassa
(74) *Attorney, Agent, or Firm* — Studebaker & Brackett PC

(57) ABSTRACT

In order to provide a circuit arrangement (100) and also a method for clock and/or data recovery (CDR) having low power consumption, having low power loss and also having scalability of the power loss from the clock and/or data recovery at the data rate,
  at least one frequency regulation circuit and
  at least one phase regulation circuit
are proposed, wherein firstly only the frequency regulation circuit is active for the purpose of setting the frequency on the basis of the data rate that can be applied to the data input and then changeover to the phase regulation circuit occurs for the purpose of ascertaining the phase difference between the data input and the clock input.

20 Claims, 4 Drawing Sheets

(= Stand der Technik = prior art)

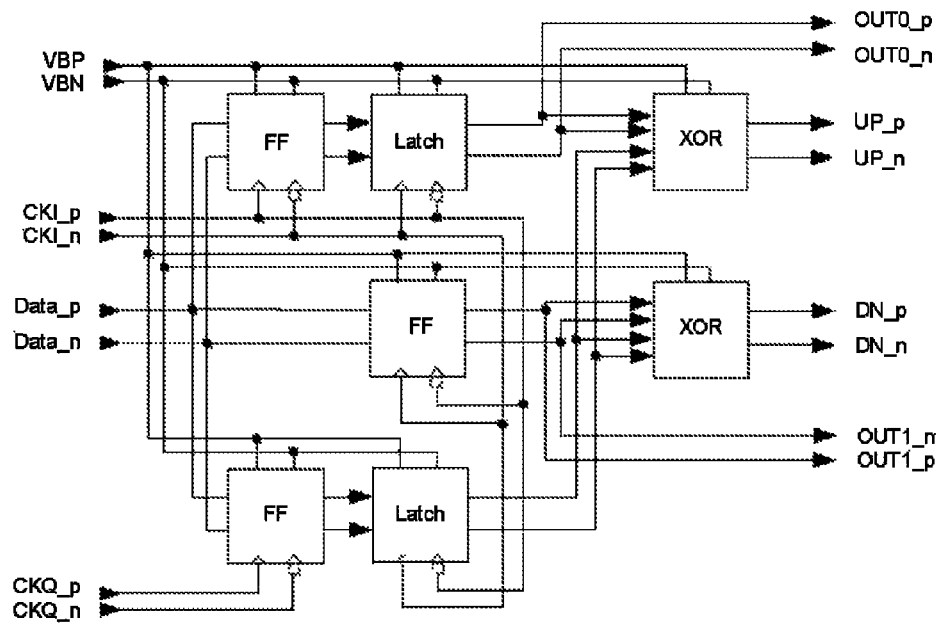
Fig. 1 (= Stand der Technik = prior art)
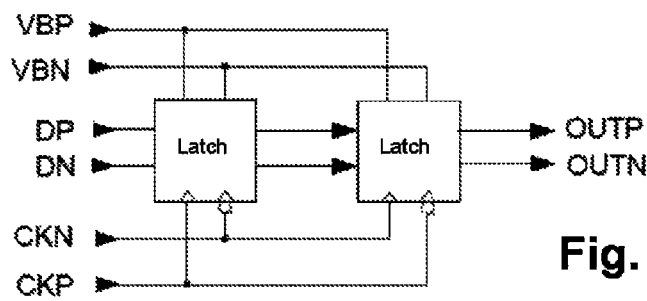
Fig. 2 (= Stand der Technik = prior art)
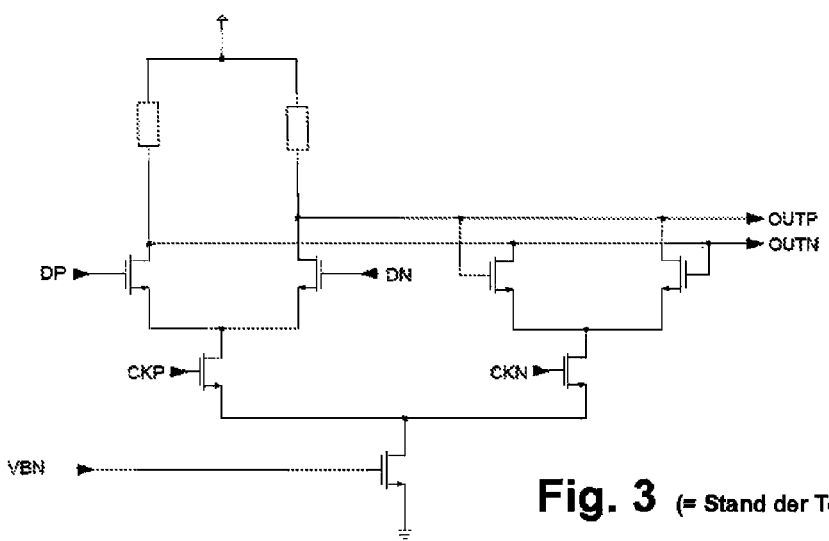
Fig. 3 (= Stand der Technik = prior art)

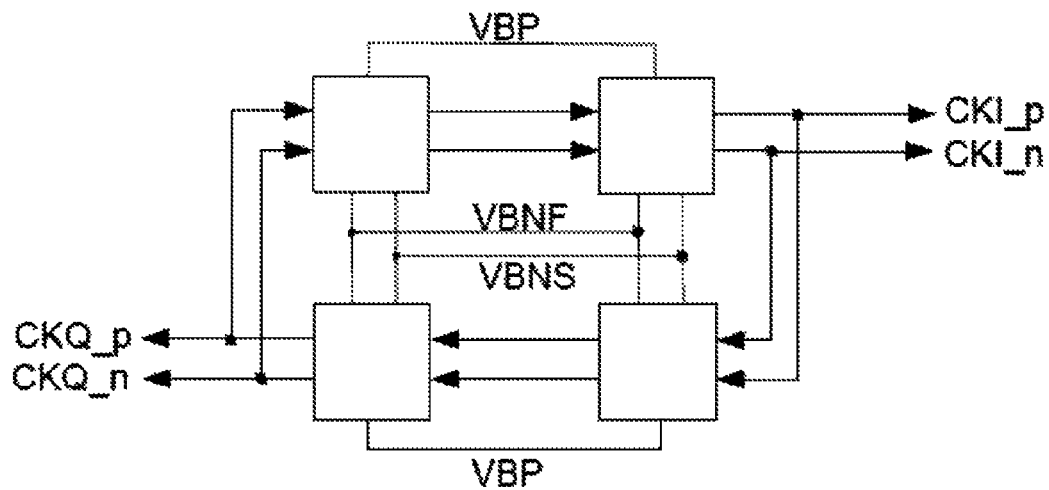
Fig. 4 (= Stand der Technik = prior art)
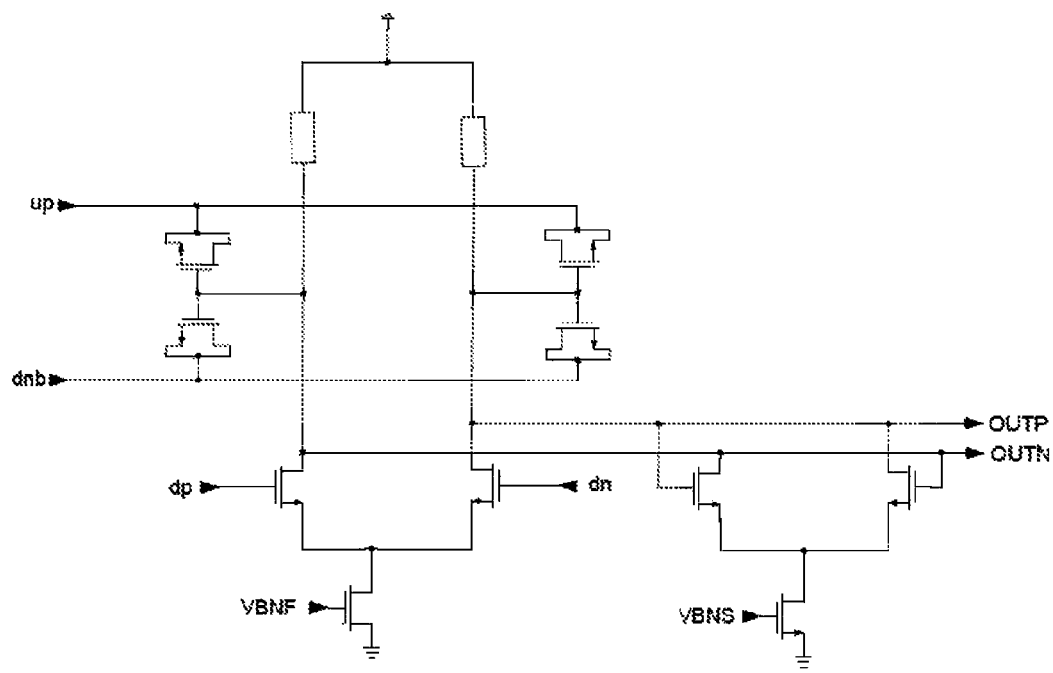
Fig. 5 (= Stand der Technik = prior art)

CIRCUIT ARRANGEMENT AND METHOD FOR CLOCK AND/OR DATA RECOVERY

CROSS-REFERENCE TO RELATED APPLICATIONS

This application is a continuation of international (WO) patent application no. PCT/DE2013/200021, filed 18 Jun. 2013, which claims the priority of German (DE) patent application no. 10 2012 105 292.1, filed 18 Jun. 2012, the contents of each being hereby incorporated herein by reference.

FIELD OF THE INVENTION

The present invention in principle relates to the technical field of clock and/or data recovery (CDR); more specifically, the present invention relates to a circuit arrangement as well as to a method for clock and/or data recovery.

BACKGROUND OF THE INVENTION

With circuits of this kind for clock and/or data recovery or CDR circuits a difference is made, in the main, between the type of phase detector and the type of voltage-controlled oscillator, as follows:

linear phase detector:
the linear phase difference at both inputs of the phase detector is indicated at the output of the phase detector;
binary phase detector:
if a bit change takes place at the data input, the plus/minus sign of the phase difference of the two inputs (clock and/or data) of the phase detector is ascertained (leading or trailing) at the output of the phase detector; this may be indicated, for example, by two digital phase detector output signals: "up" (for leading) and "down" (for trailing); for binary phase detectors the Alexander phase detector known from the state of the art is very frequently used (see FIG. 1—possible circuit for implementing a half-rate Alexander phase detector).

CDR circuits with Alexander phase detector are frequently used for data transmissions in a frequency range greater than one Gigahertz, for they are easier to implement for a limited speed of the used technology and show a very robust behaviour (better so-called power supply rejection).

For high input data rates of more than one Gigahertz the necessary logic blocks of the phase detector are normally implemented in C[urrent]M[ode]L[ogic]. FIG. 2 shows the implementation of a flip-flop in the form of two latch blocks, FIG. 3 shows the implementation of a latch with resistiveW load (so-called R-load) in C[urrent]M[ode]L[ogic], wherein the output impedance is normally implemented by discrete poly resistances.

When implementing CDR applications, where a low output jitter of the generated output clock is required, a voltage-controlled LC oscillator (VCO) is frequently used, not least because of its inherent low phase noise. Disadvantageous with this conventional type of circuit are a small tuning range and a relatively large chip surface for the implementation of the coil L on the chip.

When implementing CDR applications, where a wide tuning factor is required, a voltage-controlled ring oscillator (VCO) is frequently used. Disadvantageous with this conventional type of circuit is the output jitter, which is higher compared to the LC oscillator due to the higher phase noise of the ring oscillator. Here too, as with the phase detector for frequencies of more than one Gigahertz, the ring oscillator is usually implemented as a CML.

FIG. 4 shows a ring oscillator which is implemented in the form of four voltage-controlled oscillator buffer stages VCB and which automatically generates two clocks CLKI and CLKQ each of which comprise a phase shift of ninety degrees. The generation of CLKI and CLKQ is advantageous when implementing a half-rate phase detector.

FIG. 5 shows a possible implementation of a voltage-controlled oscillator buffer stage VCB with resistive output load (so-called R-load), wherein the frequency of the ring oscillator can be altered via a variation of the voltage at the pins VBNF and VBNS, by a factor of about 2.5. For a higher variation of the frequency of the oscillator (data rate), for example by a factor of 5, a divider (N=2) may be optionally connected at the output of the oscillator.

The disadvantages of the conventional solutions described according to the examples of FIG. 1 to FIG. 5 are, on the one hand, a high power consumption due to the necessity of an additional divider circuit (N=2) for lower data rates; on the other, these conventional solutions are not suitable for scaling the power loss of the clock and/or data recovery (CDR) with the data rate.

OBJECTS AND SUMMARY OF THE INVENTION

Starting from the above-explained disadvantages and inadequacies as well as taking the outlined prior art into account the object of the present invention is to further develop a circuit arrangement of the above-mentioned type as well as a method of the above-mentioned type in such way that low power consumption, low power loss as well as scalability of the power loss of the clock and/or data recovery at the data rate are achieved.

This object is achieved by a circuit arrangement according to the present invention with the herein described features and by a method according to the present invention with the herein described features. Advantageous embodiments and expedient further developments of the present invention are characterized in the respective sub-claims.

This object is achieved by a circuit arrangement provided for clock and/or data recovery, comprising
at least one data input,
at least one clock input,
at least one frequency regulation circuit, and
at least one phase regulation circuit,
wherein firstly only the frequency regulation circuit is active for the purpose of setting the frequency on the basis of the data rate, which can be applied to the data input and then changeover to the phase regulation circuit occurs for the purpose of ascertaining the phase difference between the data input and the clock input.

This object is further achieved by an embodiment of the circuit arrangement according to the present invention, wherein the frequency regulation circuit comprises
at least one state machine,
at least one current digital/analogue converter downstream of the state machine,
at least one current/voltage converter downstream of the current digital/analogue converter, and
at least one voltage-controlled oscillator downstream of the current/voltage converter, to which at last one control voltage signal can be applied.

This object is further achieved by an embodiment of the circuit arrangement according to the present invention, wherein the current digital/analogue converter is eight-bit programmable, in particular in that a digital eight-bit word can be applied to it.

This object is further achieved by an embodiment of the circuit arrangement according to the present invention, wherein the current/voltage converter is configured as at least one transimpedance amplifier.

This object is further achieved by an embodiment of the circuit arrangement according to the present invention, further comprising at least one voltage regulation circuit provided for setting the control voltage signal,
- with at least one voltage-controlled oscillator buffer stage,
- with at least one operational amplifier downstream of the voltage-controlled oscillator buffer stage, and
- with at least one charge pump downstream of the operational amplifier.

This object is further achieved by an embodiment of the circuit arrangement according to the present invention, wherein the voltage-controlled oscillator and/or the voltage-controlled oscillator buffer stage comprise:
- a first varactor and a second varactor, wherein the cathodic connection of the first varactor and the cathodic connection of the second varactor are connected with each other, with the source contact or emitter connection of a first transistor, with the drain contact or collector connection of a second transistor, with the drain contact or collector connection of a third transistor and with the gate contact or basis connection of a fourth transistor, and
- a third varactor and a fourth varactor, wherein the cathodic connection of the third varactor and the cathodic connection of the fourth varactor are connected with each other, with the source contact or emitter connection of a fifth transistor, with the drain contact or collector connection of a sixth transistor, with the gate contact or basis connection of the third transistor and with drain contact or collector connection of the fourth transistor.

This object is further achieved by an embodiment of the circuit arrangement according to the present invention,
- wherein the gate contact or basis connection of the first transistor and the gate contact or basis connection of the fifth transistor are connected with each other and can have the control voltage signal applied to them,
- wherein the source contact or emitter connection of the second transistor and the source contact or emitter connection of the sixth transistor are connected with each other as well as with the drain contact or collector connection of a seventh transistor, to the gate contact or basis connection of which a first output voltage signal of the current/voltage converter can be applied, and the source contact or emitter connection of which is connected with a reference potential, in particular with the earth potential or ground potential or zero potential, and
- wherein the source contact or emitter connection of the third transistor and the source contact or emitter connection of the fourth transistor are connected with each other as well as with the drain contact or collector connection of an eighth transistor, to the gate contact or basis connection of which a second output voltage signal of the current/voltage converter can be applied, and the source contact or emitter connection of which is connected with a reference potential, in particular with the earth potential or ground potential or zero potential.

This object is further achieved by an embodiment of the circuit arrangement according to the present invention, wherein the phase regulation circuit comprises
- at least one phase detector,
- at least one charge pump downstream of the phase detector,
- at least one voltage/current converter downstream of the charge pump, and and the voltage-controlled oscillator.

This object is further achieved by an embodiment of the circuit arrangement according to the present invention, wherein the phase detector is configured at least as a binary phase detector, in particular as at least a bang-bang-phase detector or as at least an upward/downward phase detector.

This object is further achieved by an embodiment of the circuit arrangement according to the present invention, wherein the phase detector comprises at least one latch circuit configured in particular as at least a flip-flop, for example as at least a state-controlled flip-flop,
- wherein the source contact or emitter connection of a first transistor is connected with the drain contact or collector connection of a second transistor, with the drain contact or collector connection of a third transistor and with the gate contact or basis connection of a fourth transistor,
- wherein the source contact or emitter connection of a fifth transistor is connected with the drain contact or collector connection of a sixth transistor, with the gate contact or basis connection of the third transistor and with the drain contact or collector connection of the fourth transistor, and
- wherein the gate contact or basis connection of the first transistor and the gate contact or basis connection of the fifth transistor are connected with each other and can have the control voltage signal applied to them.

This object is further achieved by an embodiment of the circuit arrangement according to the present invention,
- wherein the source contact or emitter connection of the second transistor and the source contact or emitter connection of the sixth transistor are connected with each other as well as with the drain contact or collector connection of a seventh transistor, to the gate contact or basis connection of which a first clock signal can be applied,
- wherein the source contact or emitter connection of the third transistor and the source contact or emitter connection of the fourth transistor are connected with each other as well as with the drain contact or collector connection of an eighth transistor, to the gate contact or basis connection of which a second clock signal can be applied, and
- wherein the source contact or emitter connection of the seventh transistor and the source contact or emitter connection of the eighth transistor are connected with each other as well as with the drain contact or collector connection of a ninth transistors, the source contact or emitter connection of which are connected with a reference potential, in particular with the earth potential or ground potential or zero potential.

This object is further achieved by an embodiment of the circuit arrangement according to the present invention,
- wherein the first transistor and/or the fifth transistor of the voltage-controlled oscillator, and/or
- wherein the first transistor and/or the fifth transistor of the latch circuit of the phase detector are/is configured as an n-channel metal oxide semiconductor field effect transistor.

This object is further achieved by an embodiment of the circuit arrangement according to the present invention, wherein the output current of the current digital/analogue converter and of the voltage/current converter summed by means of at least one adder can be applied to the input of the current/voltage converter.

This object is achieved by a method provided for clock and/or data recovery, said method comprising
- at least one frequency regulation, and at least one phase regulation, wherein firstly only the frequency regulation circuit is active for the purpose of setting the frequency on the basis of the data rate, and then changeover to the phase regulation circuit occurs for the purpose of ascertaining the phase difference between the data input and the clock input.

This object is further achieved by a use of at least one circuit arrangement according to the present invention and/or of the method according to the present invention for clock and/or data recovery with at least one phase detector and with at least one voltage-controlled oscillator.

According to the present invention, a CDR concept is provided for a large tuning range (with a factor of at least 5) with low power loss. To this end the conventionally resistive loads are replaced in the C[urrent]M[ode]L[ogic] by transistors, in particular NMOS transistors, for example n-channel metal oxide semiconductor field effect transistors, which function as load resistances.

Due to this measure both the conductive value of the VCO buffer stage and the output load can be varied in dependence of the oscillator output frequency, which leads to a higher tuning range of the voltage-controlled oscillator, in particular the voltage-controlled LC oscillator, for example the ring oscillator.

Since also in the CML of the phase detector in all logic gates, the conventionally resistive loads are replaced by transistors functioning as load resistances, in particular NMOS loads, the power loss of the CDR circuit becomes automatically dependent on the data rate at the input of the CDR circuit. This means, for example, that when halving the data rate at the CDR input, the power loss of the CRD circuit is reduced by a factor of 4.

In principle the CDR circuit comprises
at least one frequency regulation circuit and
at least one phase regulation circuit,
wherein firstly only the frequency regulation circuit is active for the purpose of setting the frequency on the basis of the data rate, which can be applied to the data input and then changeover to the phase regulation circuit occurs for the purpose of ascertaining the phase difference between the data input and the clock input.

Finally the present invention relates to the use of at least one circuit arrangement of the kind explained above and/or of a method of the kind explained above for the clock and/or data recovery (CDR) with at least one phase detector and with at least one voltage-controlled oscillator, in particular for optimized power loss with regard to a variation of the input data rate by a factor of approximately 5.

The present invention is thus characterized on the one hand by a low power requirement, i.e. by low energy consumption, for the power requirement is a function of the data rate; on the other hand, due to the present invention, low power loss can also be realised because the circuit according to the present invention and the method according to the present invention are able to operate with a very low supply voltage, for example in the range of less of 1.5 volt.

Also, due to the present invention, it is possible to achieve a large variation of the data rate—by a factor of approximately 5—for in the C[urrent]M[ode]L[ogic] used, in addition to the conductive value, the output load is also set to the optimal value. As a result the power loss of the clock and/or data recovery can be scaled with the data rate in a particularly convenient manner.

BRIEF DESCRIPTION OF THE DRAWINGS

As already discussed above, there are various possibilities for embodying and further developing the teaching of the present invention in an advantageous manner. For this purpose, on the one hand reference is made to the explanations above and to the dependent claims, and on the other hand further embodiments, features and advantages of the present invention are explained in greater detail below, inter alia by way of the exemplary embodiments illustrated by FIG. 6 to FIG. 9.

It is shown in:

FIG. 1 in a conceptual schematic view, an exemplary circuit for a half-rate state-of-the-art Alexander phase detector which operates according to the state-of-the-art method;

FIG. 2 in a conceptual schematic view, an exemplary circuit for a state-of-the-art flip-flop, which operates according to the state-of-the-art method;

FIG. 3 in a conceptual schematic view, an exemplary circuit for a latch with resistive load in the state-of-the-art C[urrent]M[ode]L[ogic], which operates according to the state-of-the-art method;

FIG. 4 in a conceptual schematic view, an exemplary circuit for a state-of-the-art ring oscillator, which operates according to the state-of-the-art method;

FIG. 5 in a conceptual schematic view, an exemplary circuit for a voltage-controlled state-of-the-art oscillator buffer stage, which operates according to the state-of-the-art method;

Like or similar embodiments, elements or features are provided with identical reference numerals in FIG. 1 to FIG. 9, wherein with regard to the signal markings/the corresponding signal inputs and outputs no difference is made between lower and upper case letters.

DETAILED DESCRIPTION OF THE INVENTION

Figure 9:
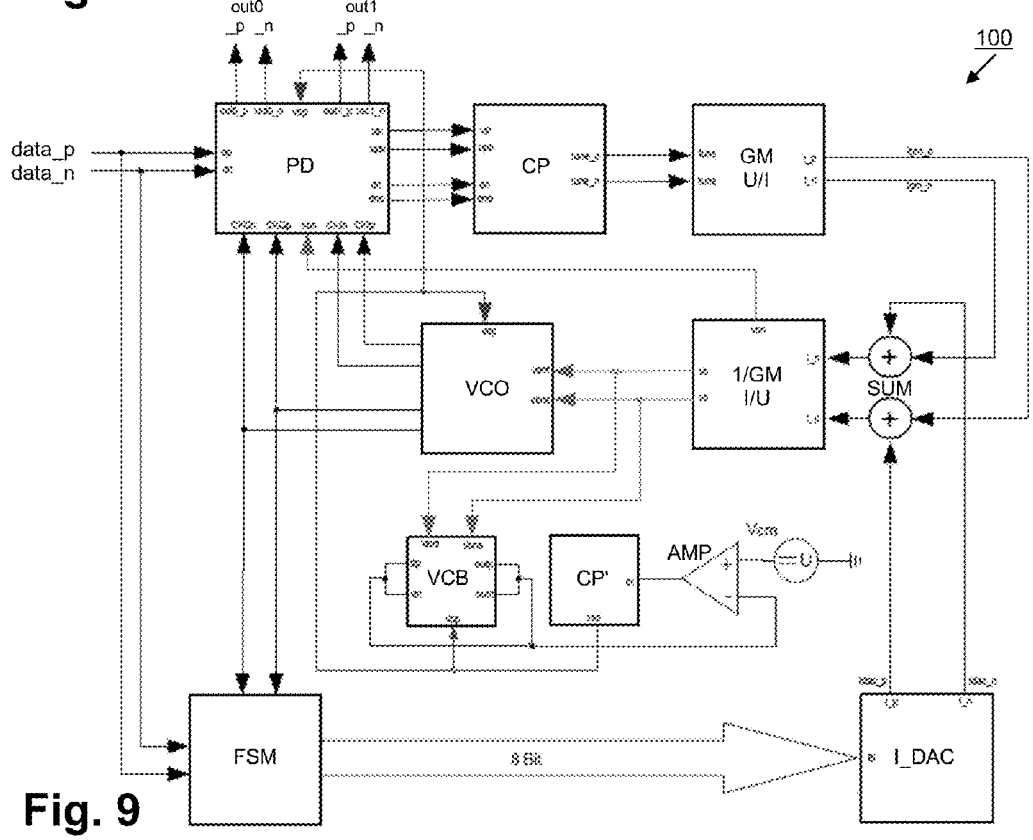
FIG. 9 in a conceptual schematic view, an exemplary embodiment for a circuit arrangement according to the present invention, which operates according to the method of the present invention.

The circuit arrangement 100 for clock and/or data recovery (CDR) of FIG. 9, provided with a data input and a clock input, conceptually essentially comprises at least two control loops.

The first control loop in the form of a frequency regulation circuit comprises a state machine FSM, an eight-bit programmable current digital/analogue converter I_DAC downstream of the state machine FSM, a current/voltage converter 1/GM in the form of a transimpedance amplifier downstream of the current digital/analogue converter I_DAC and a voltage-controlled oscillator VCO downstream of the current/voltage converter 1/GM, to which a control voltage signal VBP can be applied, wherein the oscillator may be configured in particular as a voltage-controlled LC oscillator, e.g. as a ring oscillator.

Figure 6:
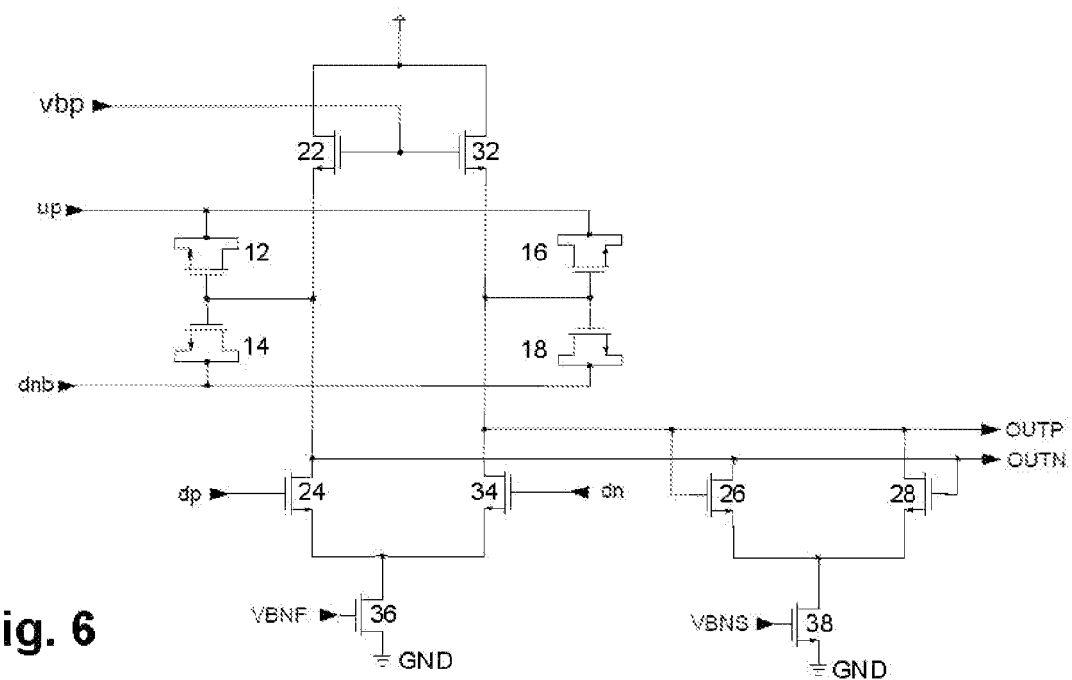
FIG. 6 in a conceptual schematic view, an exemplary embodiment for a voltage-controlled oscillator buffer stage according to the present invention, which is part of the circuit arrangement of FIG. 9 according to the present invention and which operates according to the method of the present invention.

As shown in the detail view of FIG. 6 the voltage-controlled oscillator VCO and/or a voltage-controlled oscillator-buffer stage VCB may comprise:

a first varactor 12 and a second varactor 14, wherein the cathodic connection of the first varactor 12 and the cathodic connection of the second varactor 14 are connected with each other, with the source contact or emitter connection of a first transistor 22, with the drain contact or collector connection of a second transistor 24, with the drain contact or collector connection of a third transistor 26 and with the gate contact or basis connection of a fourth transistor 28, and a third varactor 14 and a fourth varactor 16, wherein the cathodic connection of the third varactor 14 and the cathodic connection of the fourth varactor 16 are connected with each other, with the source contact or emitter connection of a fifth transistor 32, with the drain contact or collector connection of a sixth transistor 34, with the gate contact or basis connection of the third transistor 26 and with the drain contact or collector connection of the fourth transistor 28.

With this arrangement the gate contact or basis connection of the first transistor 22 and the gate contact or basis connection of the fifth transistor 32 are connected with each other and can have the control voltage signal VBP applied to them, the source contact or emitter connection of the second transistor 24 and the source contact or emitter connection of the sixth transistor 34 are connected with each other as well as with the drain contact or collector connection of a seventh transistor 66, to the gate contact or basis connection of which a first output voltage signal VBNF of the current/voltage converter 1/GM can be applied, and the source contact or emitter connection of which is connected with a reference potential GND, in particular with the earth potential or ground potential or zero potential, the source contact or emitter connection of the third transistor 26 and the source contact or emitter connection of the fourth transistor 28 are connected with each other as well as with the drain contact or collector connection of an eighth transistor 38, to the gate contact or basis connection of which a second output voltage signal VBNS of the current/voltage converter 1/GM can be applied, and the source contact or emitter connection of which is connected with a reference potential GND, in particular with the earth potential or ground potential or zero potential.

The second control loop in the form of a phase regulation circuit comprises a phase detector PD, a charge pump CP downstream of the phase detector PD, a voltage/current converter GM downstream of the charge pump CP, and the voltage-controlled oscillator VCO.

Figure 7:
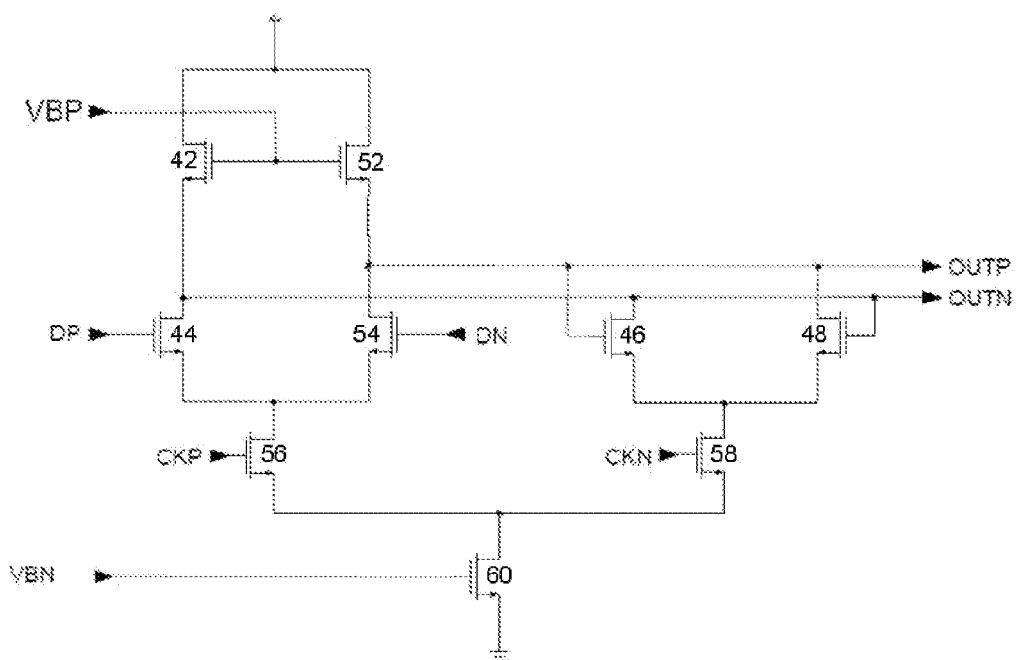
FIG. 7 in a conceptual schematic view, an exemplary embodiment for a latch according to the present invention, configured as a flip-flop circuit such as a state-controlled flip-flop circuit, which is part of the circuit arrangement of FIG. 9 according to the present invention and which operates according to the method of the present invention.

As can be seen in the detail view of FIG. 7, the phase detector PD comprises a latch circuit configured as a state-controlled flip-flop, wherein the source contact or emitter connection of a first transistor 42 is connected with the drain contact or collector connection of a second transistor 44, with the drain contact or collector connection of a third transistor 46 and with the gate contact or basis connection of a fourth transistor 48, wherein the source contact or emitter connection of a fifth transistor 52 is connected with the drain contact or collector connection of a sixth transistor 54, with the gate contact or basis connection of the third transistor 46 and with the drain contact or collector connection of the fourth transistor 48 and wherein the gate contact or basis connection of the first transistor 42 and the gate contact or basis connection of the fifth transistor 52 are connected with each other and which can have the control voltage signal VBP applied to them.

With this arrangement the source contact or emitter connection of the second transistor 44 and the source contact or emitter connection of the sixth transistor 54 are connected with each as well as with the drain contact or collector connection of a seventh transistor 56, to the gate contact or basis connection of which a first clock signal CKP can be applied, the source contact or emitter connection of the third transistor 46 and the source contact or emitter connection of the fourth transistor 48 are connected with each other as well as with the drain contact or collector connection of an eighth transistor 58, to the gate contact or basis connection of which a second clock signal CKN can be applied, the source contact or emitter connection of the seventh transistor 56 and the source contact or emitter connection of the eighth transistor 58 are connected with each other as well as with the drain contact or collector connection of a ninth transistor 60, the source contact or emitter connection of which is connected with a reference potential GND, in particular with the earth potential or ground potential or zero potential.

The output current of the current digital/analogue converter I_DAC and of the voltage/current converter GM summed by means of an adder SUM, is applied to the input of the current/voltage converter 1/GM.

When the CDR circuit 100 (see FIG. 9) is switched on, for example following a power-ON reset, the first control loop, i.e. the frequency regulation is active. The state block FSM compares the number of data flanks with the number of clock flanks and provides, at its output, a digital eight-bit word for the input of the current digital/analogue converter I_DAC.

With this arrangement the state machine or the state block FSM is also called a finite state machine representing a model of a behaviour consisting of states, state transitions and actions.

The current digital/analogue converter I_DAC converts the difference of the data and clock flanks into a differential current Idac_p and Ida_n.

The sum of the current formed by the current adder SUM from the current digital/analogue converter I_DAC and the voltage/current converter GM is converted, in the downstream current/voltage converter 1/GM, into corresponding voltage values VBNF and VBNS for the voltage-controlled oscillator VCO, wherein the differential output current Idac_p, Idac_n of the voltage/current converter GM is zero at this point, for the second control loop in the form of the phase regulation circuit is not active.

The first control loop is a pure frequency regulation which adjusts the current digital/analogue converter I_DAC and the voltage-controlled oscillator VCO in such a way that at the end of the control time constant the oscillator frequency is equal to the data rate at the input of the CDR circuit 100. With the aid of this regulation the voltage-controlled oscillator VCO can always adjust itself to the correct data rate as long as the data rate moves within a range smaller than a factor of 5.

Figure 8:
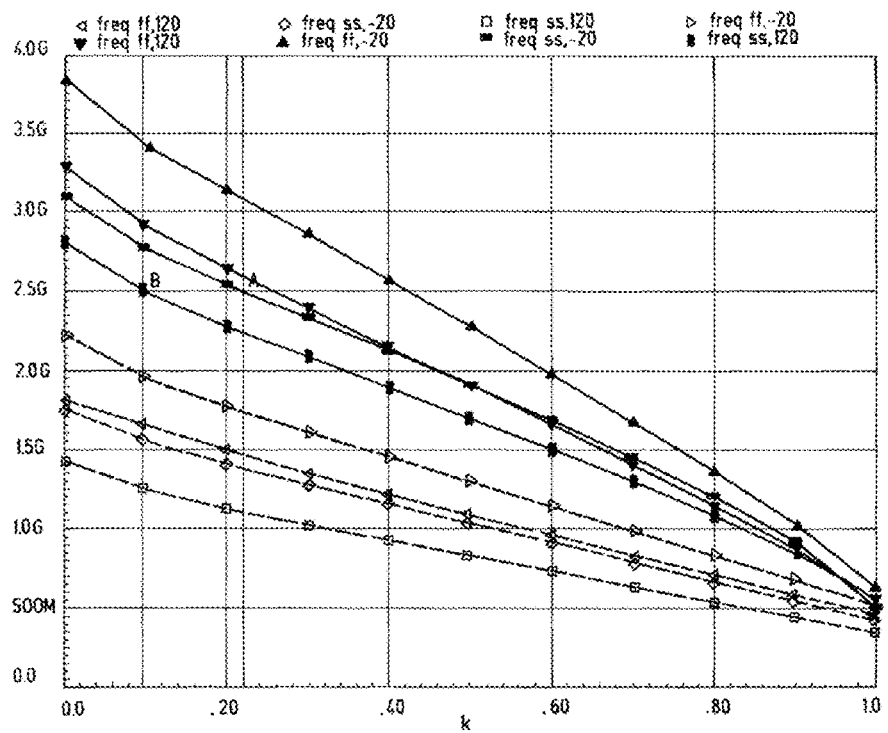
FIG. 8 in a diagrammatic view, the tuning characteristic of the voltage-controlled oscillator of FIG. 6, wherein the control voltage is plotted on the right axis.

Compared to the state of the art no additional dividers are required in the voltage-controlled oscillator VCO, because the voltage-controlled oscillator VCO alone already comprises a tuning range of about a factor of 5 across (slow and fast parameter) process and temperature fluctuations (minus twenty degree Celsius up to 120 degree Celsius), as revealed in the exemplary diagram of FIG. 8, in which the tuning range of the voltage-controlled oscillator VCO is illustrated.

The voltage values VBNF and VBNS adjust the conductive value of the voltage-controlled oscillator buffer stages VCO, VCB to the correct values; in addition the load resistance in these buffers has to be adjusted to the correct value. This may be realised via the control voltage VBP which corresponds to the gate voltage of the NMOS load provided by the n-channel metal oxide semiconductor field effect transistors 22, 32/42, 52.

Since for data rates of substantially more than one Gigahertz technologies with channel lengths of at most 0.13 micrometers are normally used, the maximum possible supply voltage is limited; for example the maximum supply voltage for a 0.13 micrometer technology is normally 1.5 volt approximately. This means, however, that the voltage at VBP must be greater than the supply voltage (approximately 2.2 volt) in order to ensure optimal functioning.

For this reason the control voltage VBP is adjusted via a third or further or additional control loop functioning as a voltage control circuit in such a way that for each adjusted VBNS and VBNF the correct, in particular optimal value adjusts itself for the control voltage VBP.

This further or additional control circuit comprises a charge pump CP' which is a copy or replica VCB of the buffer VCO and an operational amplifier AMP. The charge pump CP' which can generate a voltage of up to twice the supply voltage VDD, is suitable for this type of regulation, for the increased output voltage only goes to the gate connections of the NMOS load transistors 22, 32/42, 52; thus no current is needed at the output of the pump CP'.

Once the first control loop or frequency control loop has adjusted the VCO frequency and the working points of the C[urrent]M[ode]L[ogic] gates in the phase detector PD and in the voltage-controlled oscillator VCO to the correct values on the basis of the data rate, the eight-bit value for the current digital/analogue converter I_DAC is frozen and a changeover occurs to the second control loop or phase control loop.

In this second control loop the phase difference between data input and clock input of the circuit arrangement 100 is ascertained (leading or trailing) in the phase detector PD and provided in the form of digital signals "UP" (for leading) and "DN" (for trailing) at the input of the charge pump CP.

The charge pump CP converts the incoming UP/DN signals into a tuning voltage tune_p/tune_n, and the downstream voltage/current converter GM provides a differential current Igm_p and Igm_n at the output.

Thereafter the current Igm_p/Igm_n of the voltage/current converter GM is summed in the current adder SUM with the previously set current Idac_p/Idac_n of the current digital/analogue converter I_DAC and provided in the current/voltage converter 1/GM as output voltage VBNF and VBNS for the voltage-controlled oscillator VCO.

This second control loop is a pure phase regulation and comprises a tuning range of approximately three percent.

To summarise, the present invention provides a CDR concept (see FIG. 9) for a large tuning range (→← factor of at least 5) for a low power loss. To this end the resistive loads in the C[urrent]M[ode]L[ogic] are replaced by NMOS transistors 22, 32 functioning as load resistances (see FIG. 6—VCO buffer stage with transistor load, i.e. with NMOS load 22, 32).

Due to this measure both the conductive value of the VCO buffer stage and the output load can be varied on the basis of the oscillator output frequency, which leads to a larger tuning range of the voltage-controlled oscillator VCO, VCB.

Since also in the C[urrent]M[ode]L[ogic] of the phase detector PD the resistive loads are replaced by NMOS loads 42, 52 in all logic gates (see FIG. 7—latch with transistor load, i.e. with NMOS load 42, 52), the power loss of the CDR circuit 100 (see FIG. 9) becomes automatically dependent on the data rate at the (data) input of the CDR circuit 100. This means, for example, that if the data rate at the CDR input is halved, the power loss of the CDR circuit 100 is reduced by a factor of 4.

LIST OF REFERENCE NUMERALS

100 circuit arrangement for clock and/or data recovery
12 first varactor of the voltage-controlled oscillator VCO and/or the voltage-controlled oscillator stage VCB
14 second varactor of the voltage-controlled oscillator VCO and/or the voltage-controlled oscillator stage VCB
16 third varactor of the voltage-controlled oscillator VCO and/or the voltage-controlled oscillator stage VCB
18 fourth varactor of the voltage-controlled oscillator VCO and/or the voltage-controlled oscillator stage VCB
22 first transistor, in particular n-channel metal oxide semiconductor field effect transistor, of the voltage-controlled oscillator VCO and/or the voltage-controlled oscillator stage VCB
24 second transistor of the voltage-controlled oscillator VCO and/or the voltage-controlled oscillator stage VCB
26 third transistor of the voltage-controlled oscillator VCO and/or the voltage-controlled oscillator stage VB
28 fourth transistor of the voltage-controlled oscillator VCO and/or the voltage-controlled oscillator stage VCB
32 fifth transistor, in particular in particular n-channel metal oxide semiconductor field effect transistor, of the voltage-controlled oscillator VCO and/or the voltage-controlled oscillator stage VCB
34 sixth transistor of the voltage-controlled oscillator VCO and/or the voltage-controlled oscillator stage VCB
36 seventh transistor of the voltage-controlled oscillator VCO and/or the voltage-controlled oscillator stage VCB
38 eighth transistor of the voltage-controlled oscillator VCO and/or the voltage-controlled oscillator stage VCB
42 first transistor, in particular n-channel metal oxide semiconductor field effect transistor, of the latch circuit, in particular the flip-flop circuit, for example the state-controlled flip-flop circuit of the phase detector PD
44 second transistor of the latch circuit, in particular the flip-flop circuit, for example the state-controlled flip-flop circuit of the phase detector PD
46 third transistor of the latch circuit, in particular the flip-flop circuit, for example the state-controlled flip-flop circuit of the phase detector PD
48 fourth transistor of the latch circuit, in particular the flip-flop circuit, for example the state-controlled flip-flop circuit of the phase detector PD
52 fifth transistor, in particular n-channel metal oxide semiconductor field effect transistor, of the latch circuit, in particular the flip-flop circuit, for example the state-controlled flip-flop circuit of the phase detector PD
54 sixth transistor of the latch circuit, in particular the flip-flop circuit, for example the state-controlled flip-flop circuit of the phase detector PD
56 seventh transistor of the latch circuit, in particular the flip-flop circuit, for example the state-controlled flip-flop circuit of the phase detector PD 58 eighth transistor of the latch circuit, in particular the flip-flop circuit, for example the state-controlled flip-flop circuit of the phase detector PD
60 ninth transistor of the latch circuit, in particular the flip-flop circuit, for example the state-controlled flip-flop circuit of the phase detector PD
AMP operational amplifier
CKP first clock signal
CKN second clock signal
CP charge pump of the phase regulation circuit, in particular the second control loop
CP' charge pump of the voltage regulation circuit, in particular the third or further or additional control loop
FSM state machine, in particular finite automatic machine or state automatic machine
GM voltage/current converter
1/GM current/voltage converter, in particular transimpedance amplifier
GND reference potential, in particular earth potential or ground potential or zero potential
Idac_p,n differential current at the output of the current digital/analogue converter I_DAC
I_DAC current digital/analogue converter
Igm_p,n differential current at the output of the voltage/current converter GM
PD phase detector, in particular binary phase detector, for example bang-bang phase detector or upward/downward phase detector
SUM adder, in particular current adder
tune_p,n tuning voltage
VBNF first output voltage signal of the current/voltage converter 1/GM
VBNS second output voltage signal of the current/voltage converter 1/GM
VBP control voltage (signal)
VCO voltage-controlled oscillator, in particular voltage-controlled LC oscillator, for example ring oscillator or voltage-controlled oscillator buffer stage of the phase regulation circuit, in particular of the second control loop
VCB voltage-controlled oscillator, in particular voltage-controlled LC oscillator, for example ring oscillator or voltage-controlled oscillator buffer stage of the phase regulation circuit, in particular of the third or further or additional control loop
VDD supply voltage

What is claimed is:

1. A circuit arrangement for clock and/or data recovery, comprising
at least one data input,
at least one clock input,
at least one frequency regulation circuit, and
at least one phase regulation circuit,
wherein firstly only the frequency regulation circuit is active for the purpose of setting the frequency on the basis of the data rate, which can be applied to the data input and then changeover to the phase regulation circuit occurs for the purpose of ascertaining the phase difference between the data input and the clock input, and
wherein the frequency regulation circuit comprises
at least one state machine,
at least one current digital/analogue converter downstream of the state machine,
at least one current/voltage converter downstream of the current digital/analogue converter, and
at least one voltage-controlled oscillator downstream of the current/voltage converter, to which at least one control voltage signal can be applied,
the circuit arrangement further comprising at least one voltage regulation circuit provided for setting the control voltage signal,
with at least one voltage-controlled oscillator buffer stage,
with at least one operational amplifier downstream of the voltage-controlled oscillator buffer stage, and
with at least one charge pump downstream of the operational amplifier.

2. The circuit arrangement according to claim 1, wherein the current digital/analogue converter is eight-bit programmable.

3. The circuit arrangement according to claim 1, wherein the current/voltage converter is configured as at least one transimpedance amplifier.

4. A method for clock and/or data recovery for the circuit arrangement according to claim 1, comprising
at least one frequency regulation, and
at least one phase regulation,
wherein firstly only the frequency regulation circuit is active for the purpose of setting the frequency on the basis of the data rate, and then changeover to the phase regulation circuit occurs for the purpose of ascertaining the phase difference between the data input and the clock input.

5. Use of at least one circuit arrangement according to claim 1 for clock and/or data recovery with at least one phase detector and with at least one voltage-controlled oscillator.

6. A circuit arrangement for clock and/or data recovery, comprising
at least one data input,
at least one clock input,
at least one frequency regulation circuit, and
at least one phase regulation circuit,
wherein firstly only the frequency regulation circuit is active for the purpose of setting the frequency on the basis of the data rate, which can be applied to the data input and then changeover to the phase regulation circuit occurs for the purpose of ascertaining the phase difference between the data input and the clock input,
wherein the frequency regulation circuit comprises
at least one state machine,
at least one current digital/analogue converter downstream of the state machine,
at least one current/voltage converter downstream of the current digital/analogue converter, and
at least one voltage-controlled oscillator downstream of the current/voltage converter, to which at least one control voltage signal can be applied, and
wherein the voltage-controlled oscillator and the voltage-controlled oscillator buffer stage comprise:
a first varactor and a second varactor, wherein the cathodic connection of the first varactor and the cathodic connection of the second varactor are connected with each other, with the source contact or emitter connection of a first transistor, with the drain contact or collector connection of a second transistor, with the drain contact or collector connection of a third transistor and with the gate contact or basis connection of a fourth transistor, and
a third varactor and a fourth varactor, wherein the cathodic connection of the third varactor and the cathodic connection of the fourth varactor are connected with each other, with the source contact or emitter connection of a fifth transistor, with the drain contact or collector connection of a sixth transistor, with the gate contact or basis connection of the third transistor and with drain contact or collector connection of the fourth transistor.

7. The circuit arrangement according to claim 6,
wherein the gate contact or basis connection of the first transistor and the gate contact or basis connection of the fifth transistor are connected with each other and can have the control voltage signal applied to them,
wherein the source contact or emitter connection of the second transistor and the source contact or emitter connection of the sixth transistor are connected with each other as well as with the drain contact or collector connection of a seventh transistor, to the gate contact or basis connection of which a first output voltage signal of the current/voltage converter can be applied, and the source contact or emitter connection of which is connected with a reference potential, and
wherein the source contact or emitter connection of the third transistor and the source contact or emitter connection of the fourth transistor are connected with each other as well as with the drain contact or collector connection of an eighth transistor, to the gate contact or basis connection of which a second output voltage signal of the current/voltage converter can be applied, and the source contact or emitter connection of which is connected with a reference potential.

8. The circuit arrangement according to claim 6, wherein the first transistor and the fifth transistor of the voltage-controlled oscillator are configured as an n-channel metal oxide semiconductor field effect transistor.

9. The circuit arrangement according to claim 6, wherein the current digital/analogue converter is eight-bit programmable.

10. The circuit arrangement according to claim 6, wherein the current/voltage converter is configured as at least one transimpedance amplifier.

11. A method for clock and/or data recovery for the circuit arrangement according to claim 6, comprising
at least one frequency regulation, and
at least one phase regulation,
wherein firstly only the frequency regulation circuit is active for the purpose of setting the frequency on the basis of the data rate, and then changeover to the phase regulation circuit occurs for the purpose of ascertaining the phase difference between the data input and the clock input.

12. A circuit arrangement for clock and/or data recovery, comprising
at least one data input,
at least one clock input,
at least one frequency regulation circuit, and
at least one phase regulation circuit,
wherein firstly only the frequency regulation circuit is active for the purpose of setting the frequency on the basis of the data rate, which can be applied to the data input and then changeover to the phase regulation circuit occurs for the purpose of ascertaining the phase difference between the data input and the clock input,
wherein the phase regulation circuit comprises
at least one phase detector,
at least one charge pump downstream of the phase detector,
at least one voltage/current converter downstream of the charge pump, and
and the voltage-controlled oscillator,
wherein the phase detector comprises at least one latch circuit,
wherein the source contact or emitter connection of a first transistor is connected with the drain contact or collector connection of a second transistor, with the drain contact or collector connection of a third transistor and with the gate contact or basis connection of a fourth transistor,
wherein the source contact or emitter connection of a fifth transistor is connected with the drain contact or collector connection of a sixth transistor, with the gate contact or basis connection of the third transistor and with the drain contact or collector connection of the fourth transistor, and
wherein the gate contact or basis connection of the first transistor and the gate contact or basis connection of the fifth transistor are connected with each other and can have the control voltage signal applied to them.

13. The circuit arrangement according to claim 12, wherein the phase detector is configured at least as a binary phase detector.

14. The circuit arrangement according to claim 12,
wherein the source contact or emitter connection of the second transistor and the source contact or emitter connection of the sixth transistor are connected with each other as well as with the drain contact or collector connection of a seventh transistor, to the gate contact or basis connection of which a first clock signal can be applied,
wherein the source contact or emitter connection of the third transistor and the source contact or emitter connection of the fourth transistor are connected with each other as well as with the drain contact or collector connection of an eighth transistor, to the gate contact or basis connection of which a second clock signal can be applied, and
wherein the source contact or emitter connection of the seventh transistor and the source contact or emitter connection of the eighth transistor are connected with each other as well as with the drain contact or collector connection of a ninth transistors, the source contact or emitter connection of which are connected with a reference potential.

15. The circuit arrangement according to claim 12, wherein the first transistor and the fifth transistor of the latch circuit of the phase detector are configured as an n-channel metal oxide semiconductor field effect transistor.

16. A method for clock and/or data recovery for the circuit arrangement according to claim 12, comprising
at least one frequency regulation, and
at least one phase regulation,
wherein firstly only the frequency regulation circuit is active for the purpose of setting the frequency on the basis of the data rate, and then changeover to the phase regulation circuit occurs for the purpose of ascertaining the phase difference between the data input and the clock input.

17. A circuit arrangement for clock and/or data recovery, comprising
at least one data input,
at least one clock input,
at least one frequency regulation circuit, and
at least one phase regulation circuit,
wherein firstly only the frequency regulation circuit is active for the purpose of setting the frequency on the basis of the data rate, which can be applied to the data input and then changeover to the phase regulation circuit occurs for the purpose of ascertaining the phase difference between the data input and the clock input,
wherein the frequency regulation circuit comprises
at least one state machine,
at least one current digital/analogue converter downstream of the state machine, at least one current/voltage converter downstream of the current digital/analogue converter, and at least one voltage-controlled oscillator downstream of the current/voltage converter, to which at least one control voltage signal can be applied, wherein the phase regulation circuit comprises at least one phase detector, at least one charge pump downstream of the phase detector, at least one voltage/current converter downstream of the charge pump, and and the voltage-controlled oscillator, and wherein the output current of the current digital/analogue converter and of the voltage/current converter summed by means of at least one adder can be applied to the input of the current/voltage converter.

18. The circuit arrangement according to claim 17, wherein the current digital/analogue converter is eight-bit programmable.

19. The circuit arrangement according to claim 17, wherein the current/voltage converter is configured as at least one transimpedance amplifier.

20. A method for clock and/or data recovery for the circuit arrangement according to claim 17, comprising at least one frequency regulation, and at least one phase regulation, wherein firstly only the frequency regulation circuit is active for the purpose of setting the frequency on the basis of the data rate, and then changeover to the phase regulation circuit occurs for the purpose of ascertaining the phase difference between the data input and the clock input.

\* \* \* \* \*